US011422027B1

(12) United States Patent
Yuan et al.

(10) Patent No.: US 11,422,027 B1
(45) Date of Patent: Aug. 23, 2022

(54) OPTICAL SWITCHABLE SYSTEM AND DEVICE

(71) Applicant: HEWLETT PACKARD ENTERPRISE DEVELOPMENT LP, Houston, TX (US)

(72) Inventors: Yuan Yuan, Milpitas, CA (US); Thomas Van Vaerenbergh, Diegem (BE); Bassem Tossoun, Santa Barbara, CA (US); Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 17/177,024

(22) Filed: Feb. 16, 2021

(51) Int. Cl.
*G01J 1/44* (2006.01)
*G02F 1/35* (2006.01)
*H01L 45/00* (2006.01)
*G01D 5/16* (2006.01)

(52) U.S. Cl.
CPC .......... *G01J 1/44* (2013.01); *G01D 5/16* (2013.01); *G02F 1/3501* (2013.01); *G02F 1/354* (2021.01); *H01L 45/1213* (2013.01); *G01J 2001/446* (2013.01)

(58) Field of Classification Search
CPC ........ G01J 1/44; G01J 2001/446; G01D 5/16; G02F 1/3501; G02F 1/354; H01L 45/1213
See application file for complete search history.

(56) References Cited

U.S. PATENT DOCUMENTS

| 8,982,260 B2 | 3/2015 | Eshraghian et al. |
| 10,009,135 B2 | 6/2018 | Tait |
| 2017/0302396 A1* | 10/2017 | Tait ..................... H04J 14/0204 |
| 2019/0372589 A1* | 12/2019 | Gould .................... H04B 10/25 |
| 2020/0019851 A1* | 1/2020 | Mehrabian ................ G06F 1/06 |
| 2021/0303983 A1* | 9/2021 | Abel ................. G11C 13/0011 |
| 2021/0335238 A1* | 10/2021 | Song ................... H01L 27/3269 |

FOREIGN PATENT DOCUMENTS

WO  WO-2017019097  2/2017

OTHER PUBLICATIONS

Feng, X. et al.; "2D Photonic Memristor Beyond Graphene: Progress and Prospects"; Nanophotonics 2020; Feb. 4, 2020; pp. 1579-1599; vol. 9 issue 7; De Gruyter.
Sung, C. et al.; "Perspective: A Review on Memristive Hardware for Neuromorphic Computation"; Journal of Applied Physics; Oct. 5, 2018; 14 pages; vol. 124; AIP Publishing.
Amin et al., "ITO-based Electro-absorption Modulator for Photonic Neural Activation Function", Emerging Materials for Neuromorphic Computing, May 31, 2019, 11 pages.

(Continued)

*Primary Examiner* — Thanh Luu
*Assistant Examiner* — Monica T Taba
(74) *Attorney, Agent, or Firm* — Hewlett Packard Enterprise Patent Department

(57) ABSTRACT

An apparatus includes a photodetector and a memristor coupled to the photodetector. The photodetector is configured to receive and convert optical signals to electrical signals to program the memristor to an on or off state. The apparatus further includes a ring resonator coupled to the memristor and configured to modulate light based on the on or off state of the memristor.

20 Claims, 6 Drawing Sheets

(56) References Cited

OTHER PUBLICATIONS

Battal et al., "Resistive Switching-based Electro-Optical Modulation", Advanced Optical Materials, 2014, 7 pages.
Feldmann et al., "Integrated 256 cell photonic phase-change memory with 512-bit capacity", IEEE Journal of Selected Topics in Quantum Electronics, Dec. 2019, 8 pages.
Goi et al., "Perspective on photonic memristive neuromorphic computing", PhotoniX, 2020, 26 pages.
Hermans et al., "Trainable hardware for dynamical computing using error backpropagation through physical media", Nature Communications, 2015, 8 pages.
Lee et al., "Demonstration of an Optoelectronic Excitatory & Inhibitory Neuron for Photonic Spiking Neural Networks", Conference on Lasers and Electro-Optics (CLEO), 2020, 2 pages.
Liang et al., "Integrated finely tunable microring laser on silicon", Nature Photonics, Sep. 12, 2016, 6 pages.
Shastri et al., "Principles of Neuromorphic Photonics", Dec. 29, 2017, 28 pages.
Wang et al., "Fully memristive neural networks for pattern classification with unsupervised learning", Springer Nature, vol. 1, Feb. 2018, pp. 137-145.
Williamson et al., "Reprogrammable Electro-Optic Nonlinear Activation Functions for Optical Neural Networks", Jul. 23, 2019, 14 pages.
Ying et al., "Electronic-photonic arithmetic logic unit for high-speed computing", Nature Communications, 2020, pp. 1-10.

\* cited by examiner

OPTICAL SWITCHABLE SYSTEM AND DEVICE

DESCRIPTION OF RELATED ART

For the conventional digital computation, the memory that stores data communicates with the central processing unit (CPU) through a shared bus, which limits the computer performance as the well-known Von Neumann bottleneck. Researches have shown that neuromorphic computing promises a capability to break the Von Neumann bottleneck, such as the memristive neural networks and the photonic neural networks. In this regard, the memristors can be used as artificial synapses due to their non-volatile multi-state conductivity.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
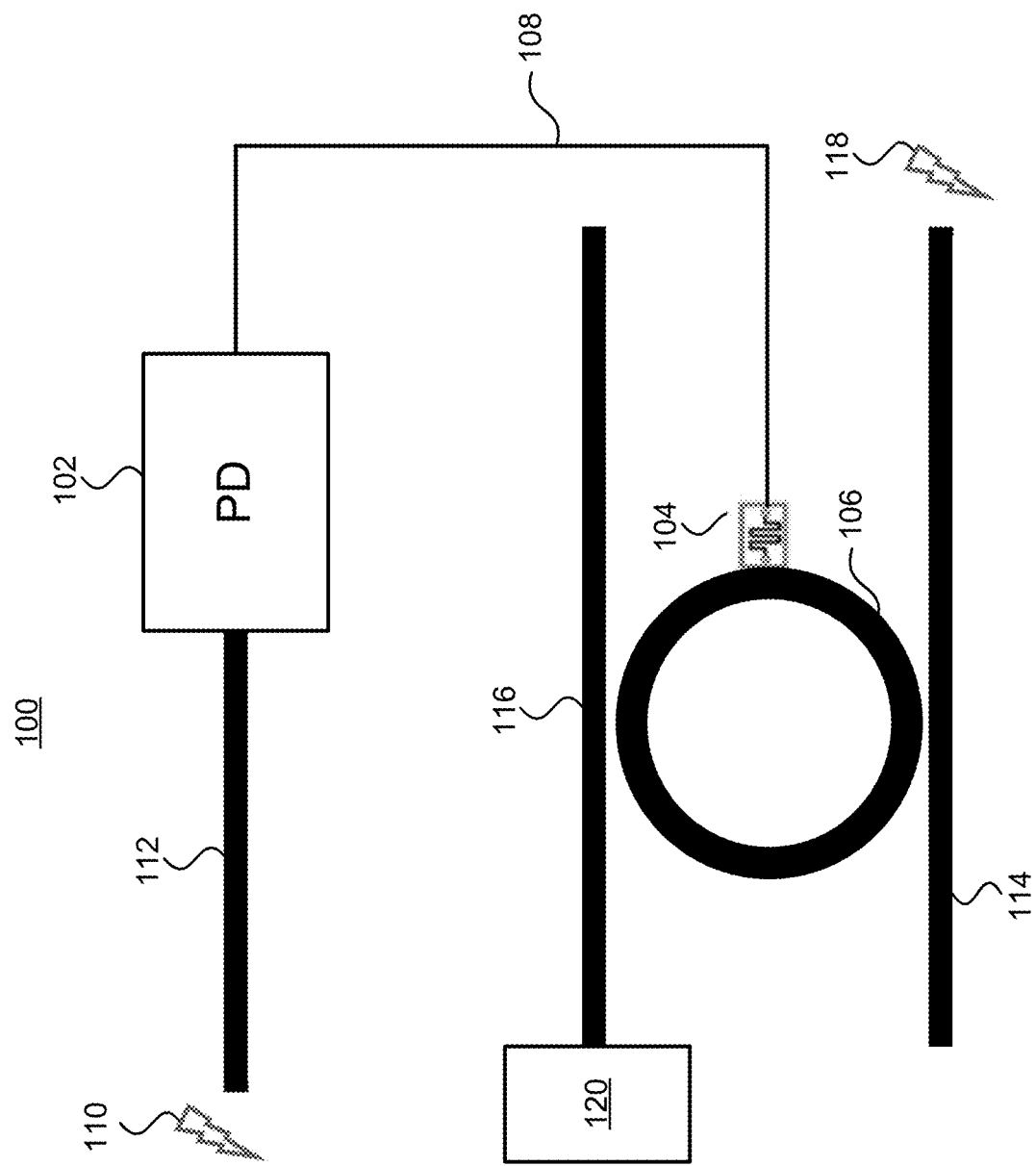
FIG. 1 is a diagram illustrating an optical system according to one example embodiment.

The figures are not exhaustive and do not limit the present disclosure to the precise form disclosed.

DETAILED DESCRIPTION

Various embodiments disclosed herein provide an optical-to-electrical-to-optical (O-E-O) control method that uses one or more photodetectors coupled to a memristor to control a ring resonator. The photocurrents generated by the one or more photodetectors can be tapped to program the memristor to different states. When the memristor is integrated with the ring resonator, the ring resonator can modulate light based on the state of the memristor.

Current photonic neural networks use photodiodes to convert optical signals to electric signals, and then input the electric signals into an external electric processing circuit to drive nonlinear optical components. Generally, the electronic circuit elements in these systems are volatile, resulting in energy-efficiency issues of these approaches. In some existing systems, an FPGA may be used to generate patterns for off-chip laser drivers; a hybrid electro-optic circuit may be employed to feed the activation function to the Mach-Zehnder interferometer; or a photodetectors array followed by electronic multiplexer units and a sum generation unit may be selected for such systems. The optical-to-electrical-to-optical (O-E-O) links in existing topologies use volatile circuit elements. Whereas the inclusion of non-volatile tuning of resonators has been proposed, no method has been proposed to execute this configurability with optical inputs. So far this approach can only be done using purely electronic peripheral circuits. In some cases, a system may rely on exotic materials that are not part of the current fabrication flow.

In various embodiments, an O-E-O method uses an optical input to directly control a non-volatile state of the optical elements, such as microring resonators, lasers, and modulators. By applying this O-E-O method, memristive optical elements can be trained on a single photonic integrated circuit (PIC) chip. By virtue of the non-volatile properties of the solution, higher energy-efficiency can be achieved. The proposed solution allows for training in the natural (i.e., optical) data encoding format.

Current electronic neuromorphic architectures are still limited by real-time information-processing bandwidth and energy efficiency. Combining an electronic neuromorphic architecture with photonic technology is a promising solution to overcome the drawbacks and can build a photonic memristive neuromorphic system with ultrafast bandwidth and low energy cost. Silicon photonic integrated circuits technology is known for the high speed, high compactness, and low energy consumption. The PICS technology provides an attractive and powerful hardware platform for the optical computation.

A microring resonator may be integrated with a memristor on PICS to obtain a non-volatile optical memory. However, the data is electrically written and optically read in the device. Techniques disclosed herein provide an optical-to-optical control method that uses one or more photodiodes to switch the memristors. Instead of switching the memristors with extra peripheral electric control circuits, various embodiments disclosed herein can address the switching of memristors as alluded to above by using an O-E-O method to enable a diverse set of applications such as a fully integrated optical memory, training of optical neurons, and optical logic computations on a single Si photonics chip platform.

Figure 2:
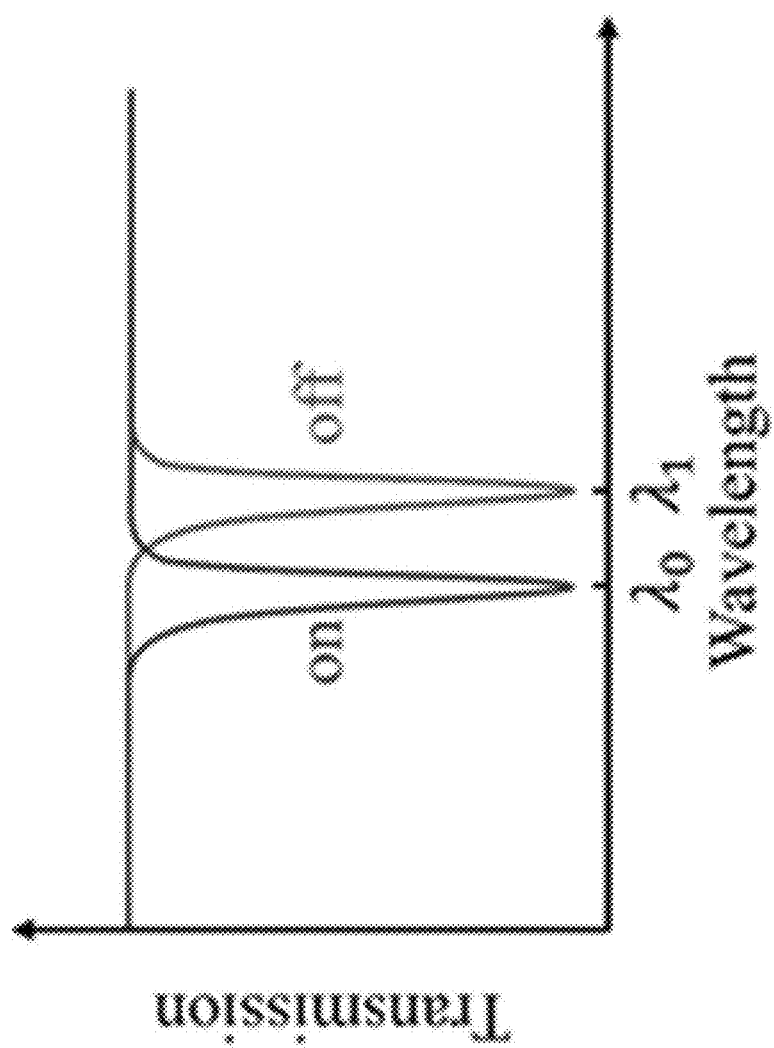
FIG. 2 is a diagram illustrating optical transmission spectra of a ring resonator according to one example embodiment.

Reference is now made to FIG. 1. FIG. 1 is a diagram illustrating an optical system 100 according to one example embodiment. The optical system 100 includes a photodetector (PD) 102, a memristor 104 coupled to the photodetector 102, and a ring resonator 106 coupled to the memristor 104. The memristor 104 is coupled to the photodetector 102 through an electrical link 108. To modulate light signals at the ring resonator 106, a control light source 110 is provided. The control light source 110 is coupled to one end of a control waveguide 112. The other end of the control waveguide 112 is coupled to the photodetector 102. The photodetector 102 receives from the control waveguide 112 optical control signals emitted by the control light source 110. The photodetector 102 then converts the optical control signals into electrical signals and outputs the electrical signals through the electrical line 108 to the memristor 104 to program the memristor 104 to an on or off state. The ring resonator 106 coupled to the memristor 104 can modulate light based on the states of the memristor 104. For example, with reference to FIG. 2, when the memristor 104 is programmed to the on state, the ring resonator 106 is configured to modulate a wavelength Xo; and when the memristor 104 is programmed to the off state, the ring resonator 106 is configured to modulate a wavelength Xi. As shown in FIG. 2, the modulated wavelength Xo when the memristor 104 is programmed to the on state is shorter than the wavelength Xi when the memristor 104 is programmed to the off state. This may be leveraged to control an optical signal at the ring resonator 106.

Referring back to FIG. 1, the optical system 100 may further include an input waveguide 114 coupled to the lower side of the ring resonator 106 and an output waveguide 116 coupled to the upper side of the ring resonator 106. One end of the input waveguide 114 is coupled to a light source 118 configured to emit light to the input waveguide 114. The light at the input waveguide 114 can be modulated and extracted by the ring resonator 106 and transferred to the output waveguide 116. The output waveguide 116 may be coupled to an output port 120 configured to output light signals from the output waveguide 116.

In some embodiments, the components of the optical system 100 can be integrated on a single PIC chip using existing complementary metal-oxide-semiconductor (CMOS) technology.

The optical system 100 enables an O-E-O method for switching a memristor-based optical memory. The photodetector 102 is used to generate sufficient photocurrent to set and reset the memristor 104. In some embodiments, the photodetector 102 may be an avalanche photodiode (APD). The APD can provide an amplitude tuning region for outputting photocurrents and reducing the laser power in the optical system 100. The photocurrent output from the photodetector 102 passing through the memristor 104 is directly controlled by the amplitude and pulse width of the input light signals from the light source 110. In some embodiments, the optical memory is formed by including the ring resonator 106 integrated with the memristor 104. The resonant wavelength of the ring resonator 106 can be switched with the memristor 104 based on the memristor's state. In some instances, the change of optical properties inside the ring resonator 106 can be determined by the effective doping concentration from the formation and rupture of filaments (micro conducting path) in the memristor 104. The techniques disclosed herein can build a bridge between the input light signal (e.g., from light source 110) and the resonant wavelength at the ring resonator 106. Similar structures can be used in other non-volatile optical elements. The photocurrents output from the photodetector 102 can also set and reset other memristor-based components, for example, memristive ring lasers, memristive Mach-Zehnder interferometers (MZI) modulators, etc.

Figure 3:
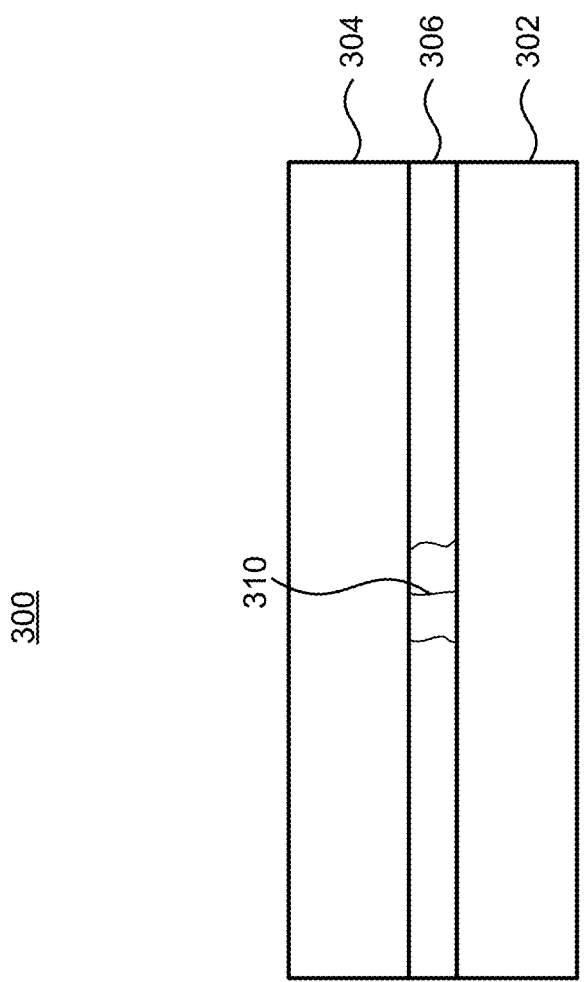
FIG. 3 is a diagram illustrating a memristor that can be applied to the optical systems disclosed herein, according to one example embodiment.

FIG. 3 is a diagram illustrating a memristor 300 that can be applied to the optical systems disclosed herein, according to one example embodiment. The memristor 300 includes a first electrode 302, a second electrode 304, and one or more oxide layers 306 interposed between the first electrode 302 and the second electrode 304. In some embodiments, the first electrode 302 and the second electrode 304 may include conductive or semi-conductive materials. For example, the first electrode 302 and the second electrode 304 may be doped semi-conductive materials, such as group IV or III-V materials. In some instances, the first electrode 302 and the second electrode 304 may include metals or alloys. The one or more oxide layers 306 may be a single oxide layer or a stack of oxide layers. In some embodiments, the one or more oxide layers 306 may include one or more of silicon dioxide, silicon nitride, and metal oxides, such as $Al_2O_3$, $HfO_2$, or $ZrO_2$. As a non-limiting example, the one or more oxide layers 306 may be a stack of $SiO_2/HfO_2/Al_2O_3$ thin films. A thickness of the one or more oxide layers 306 may be 1-10 nm, less than 8 nm, less than 6 nm, or less than 4 nm.

The memristor 300 may be programmed to its on or off state by photocurrents (e.g., those generated by the photodetector 102 of FIG. 1). As a non-limiting example, the memristor 300 can be set and reset through the creation and destruction of micro conducting paths 310 in the one or more oxide layers 306. At the set stage, the micro conducting paths 310 are created in the one or more oxide layers 306, while at the reset stage the micro conducting paths 310 are ruptured in the one or more oxide layers 306.

Figure 4:
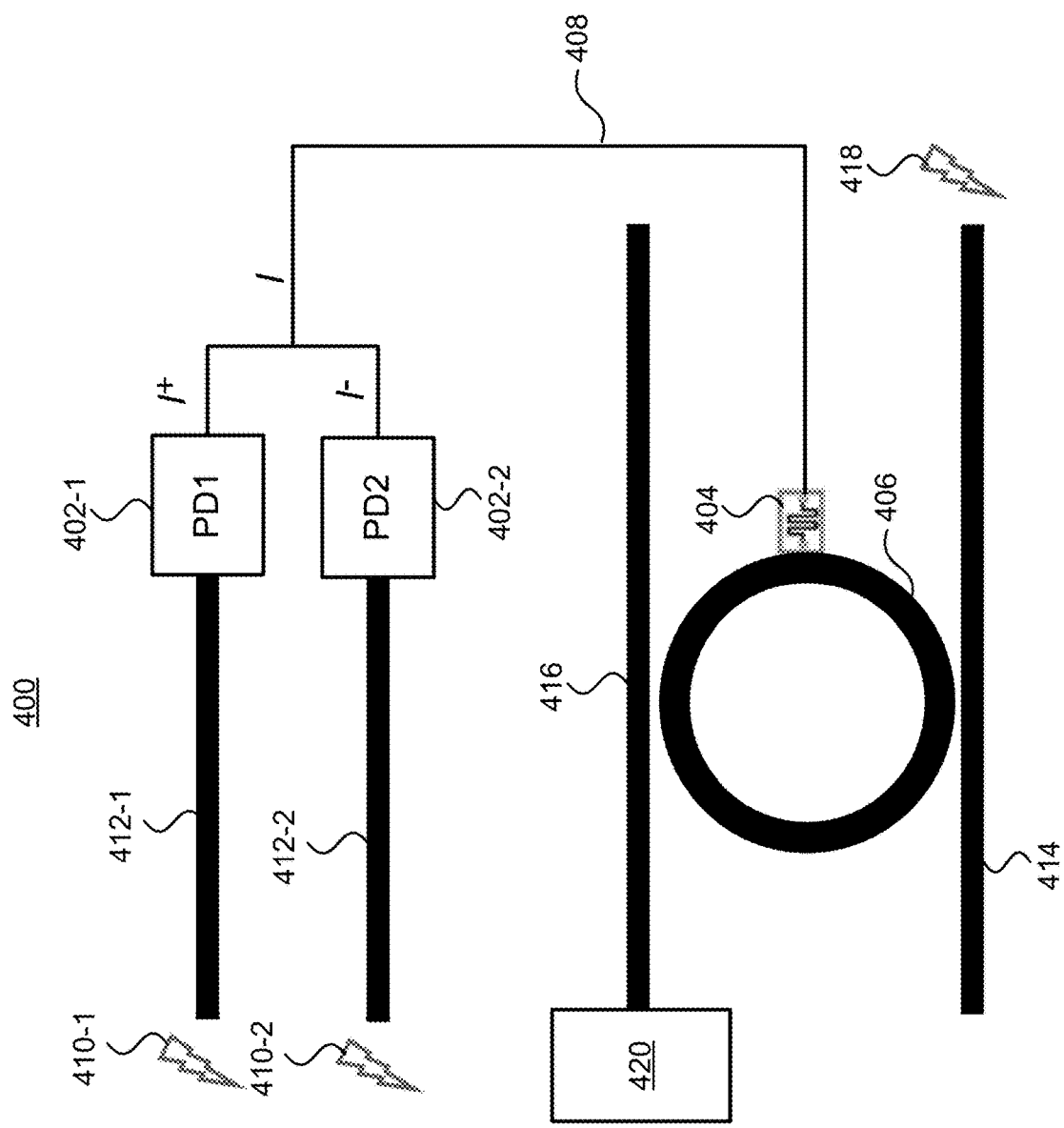
FIG. 4 is a diagram illustrating another optical system according to one example embodiment.

FIG. 4 is a diagram illustrating an optical system 400 according to one example embodiment. The optical system 400 includes a first photodetector (PD1) 402-1, a second photodetector (PD2) 402-2, a memristor 404 coupled to the photodetectors 402-1 and 402-2, and a ring resonator 406 coupled to the memristor 404. The memristor 404 is coupled to the photodetectors 402-1 and 402-2 through an electrical link 408. To modulate light signals at the ring resonator 406, each of the photodetectors 402-1 and 402-2 is provided with a light source. As shown in FIG. 4, the optical system 400 further includes a first control light source 410-1 coupled to the first photodetector 402-1, and a second control light source 410-2 coupled to the second photodetector 402-2. The optical system 400 includes a first control waveguide 412-1 coupled between the first control light source 410-1 and the first photodetector 402-1, and a second control waveguide 412-2 coupled between the second control light source 410-2 and the second photodetector 402-2.

Each of the photodetectors 402-1 and 402-2 can receive from their respective control waveguide 412-1 or 412-2 optical control signals emitted by the respective control light source 410-1 or 410-2. The photodetectors 402-1 and 402-2 then convert the optical control signals into electrical signals and output the electrical signals to the memristor 404 to program the memristor 404 to an on or off state.

The ring resonator 406 coupled to the memristor 404 can modulate light based on the states of the memristor 404. The mechanism is similar to those discussed in connection with FIG. 2. When the memristor 404 is programmed to the on state, the ring resonator 406 is configured to modulate a wavelength Xo; and when the memristor 404 is programmed to the off state, the ring resonator 406 is configured to modulate a different wavelength Xi. As shown in FIG. 2, the modulated wavelength Xo when the memristor 404 is programmed to the on state is shorter than the wavelength Xi when the memristor 404 is programmed to the off state.

Referring back to FIG. 4, the optical system 400 may further include an input waveguide 414 coupled to the lower side of the ring resonator 406 and an output waveguide 416 coupled to the upper side of the ring resonator 406. One end of the input waveguide 414 is coupled to a light source 418 configured to emit light to the input waveguide 414. The light at the input waveguide 414 can be modulated and extracted by the ring resonator 406 and transferred to the output waveguide 416. The output waveguide 416 may be coupled to an output port 420 configured to output light signals from the output waveguide 416.

Figure 5:
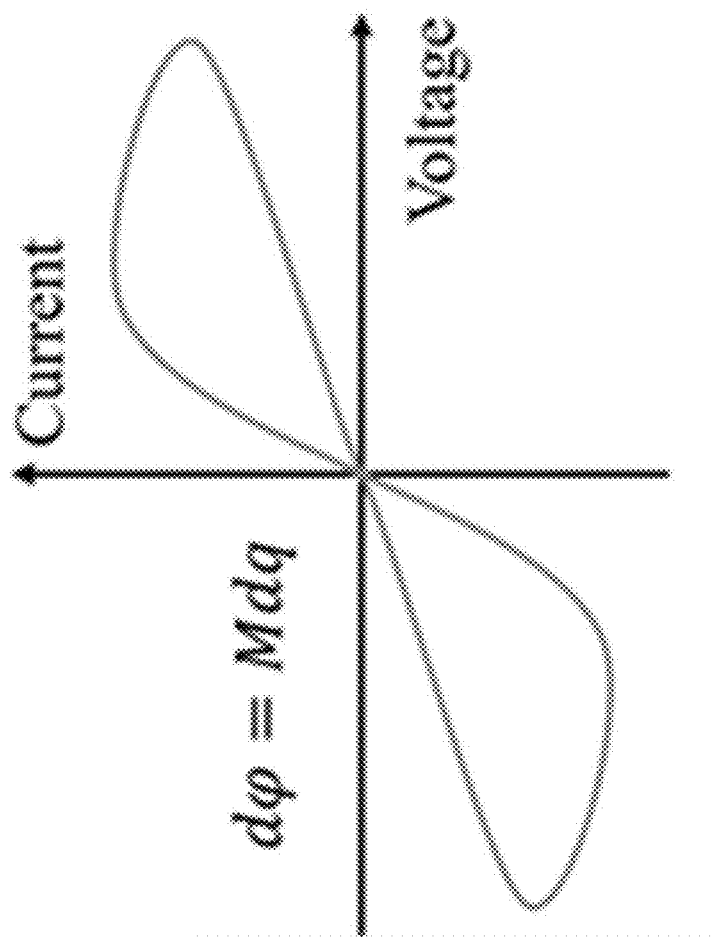
FIG. 5 is a diagram illustrating current-voltage characteristics of a memristor according to one example embodiment.

The optical system 400 enables an O-E-O method for switching a memristor-based optical memory. In some embodiments, the photodetectors 402-1 and 402-2 may be balanced avalanche photodiodes (APDs) that are used to generate sufficient photocurrent to set and reset the memristor 404 due to the internal gain. The multiplication characteristics of APDs can also provide a wide amplitude tuning region for outputting photocurrents to the memristor 404 and reducing the laser power in the system. The balanced photodiode structure generates two photocurrents, $I^+$ and $I^-$, whose amplitudes are opposite to each other and determined by input optical signals of photodetectors 402-1 and 402-2, respectively. A current-voltage characteristic of the memristor 404 is shown in FIG. 5, which relates electric charge and magnetic flux and can be expressed as:

$$d\varphi = M \times dq$$

where φ is magnetic flux, q is electric charge, and M is memristance. Since dφ/dt=V and dq/dt=I, M has a dimension of resistance (Ohm) and depends on the integral I of passed photocurrents $I^+$ and $I^-$. The integral I of output photocurrents $I^+$ and $I^{31}$ passing through the memristor 404 is directly controlled by the amplitude and pulse width of the input light signals from the control light sources 410-1 and 410-2. An optical memory can be formed by the ring resonator 406 integrated with the memristor 404. The resonant wavelength of the ring resonator 406 can be switched with the memristor 404. In some embodiments, the change of optical properties inside the ring resonator 406 can be determined by the effective doping concentration from the formation and rupture of micro conducting paths (e.g., the micro conducting paths 310 of FIG. 3) in the memristor 404. The techniques disclosed herein build a bridge between the input light signal (e.g., from light sources 410-1 and 410-2) and the resonant wavelength in the ring resonator 406. These structures can be used in other non-volatile optical elements.

Figure 6:
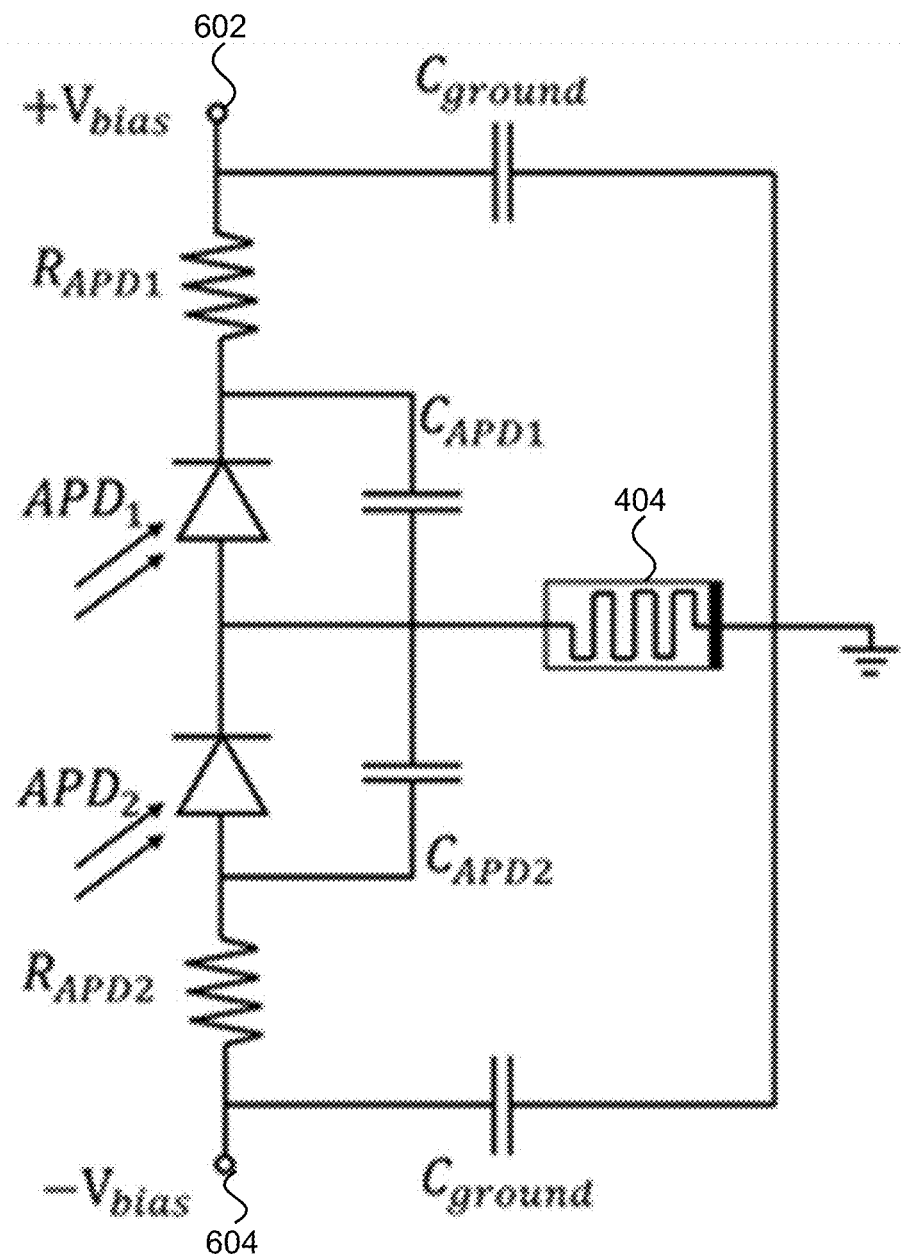
FIG. 6 is diagram illustrating an equivalent electric circuit of the optical system shown in FIG. 4.

FIG. 6 is diagram illustrating an equivalent electric circuit 600 of the optical system 400 shown in FIG. 4. Two identical photodiodes $APD_1$ and $APD_2$ are connected in series, and bias voltages $\pm V_{bias}$ are applied to the two ports 602 and 604, respectively. The resistance and capacitance of the photodiode $APD_1$ are denoted $R_{APD1}$ and $C_{APD1}$, respective. The resistance and capacitance of the photodiode $APD_2$ are denoted $R_{APD2}$ and $C_{APD2}$, respectively. The current moving through the memristor 404 is determined by the difference between the input optical signals of photodiodes $APD_1$ and $APD_2$, similar to a pull-push circuit. The switching time of this equivalent electric circuit 600 depends on the RC time constant of the equivalent circuit 600 and the required charge of the memristor 400 for state transition.

The O-E-O switching method disclosed herein has a wide range of applications including, for example, training of optical neurons. A single neuron would need both capabilities: volatile tuning for inference, and non-volatile tuning that enables training. Based on the O-E-O switching method for the non-volatile optical elements, a training mode neural network in the photonic platform can be realized. The tunability of the non-volatile optical elements indicates that they are suitable to be used as the weights. In a backpropagation mode, the error signal is received by the balanced photodiodes, and the output photocurrent changes the weights for training. In this regard, the O-E-O switching method provides a path to implement a photonic neural network with both inference and training capabilities in a single photonic integrated circuit chip.

In summary, the techniques disclosed herein provide a switching method with a single photodiode or balanced photodiodes as an O-E-O solution. The states of memristive optical devices are intrinsically determined by control light signals. These techniques erase limitations of conventional electrical switching of the memristor-based optical elements.

Further, in some embodiments, since no external circuit is needed to process the signals, the disclosed method is a simpler solution. The techniques can be implemented by applying memristors to the mature Si photonics platform, such that the disclosed O-E-O method allows all components to be implemented in a single PIC chip and compatible with the CMOS technology.

In some implementations, balanced avalanche photodiodes can further reduce the power consumption of the entire system. And due to the easily controlled linear gain characteristics of the avalanche photodiodes, the updated step size of the weights for a photonic neural network can be adjusted to find an optimization algorithm during training. The process produces a configurable hyperparameter that can be used in the training of the neural network.

Based on the disclosed techniques, a pure optical-to-optical neural network can be implemented. The techniques combine the advantages of the memristive and photonic neural networks. This photonic memristive neuromorphic system may enable ultrafast bandwidth and low energy cost. In addition, it has the potential for many applications, such as optical digital logic and optical ternary content-addressable memory (OTCAM).

As used herein, a circuit might be implemented utilizing any form of hardware, software, or a combination thereof. For example, one or more processors, controllers, application-specific integrated circuits (ASICs), programmable logic arrays (PLAs), programmable logic devices (PALS), complex programmable logic devices (CPLDs), field-programmable gate arrays (FPGAs), logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality.

In common usage, the term "or" should always be construed in the inclusive sense unless the exclusive sense is specifically indicated or logically necessary. The exclusive sense of "or" is specifically indicated when, for example, the term "or" is paired with the term "either," as in "either A or B." As another example, the exclusive sense may also be specifically indicated by appending "exclusive" or "but not both" after the list of items, as in "A or B, exclusively" and "A and B, but not both." Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:
1. An apparatus, comprising:
   a photodetector;
   a memristor coupled to the photodetector, wherein the photodetector is configured to receive and convert optical signals to electrical signals and output the electrical signals through an electrical line to the memristor to program the memristor to an on or off state; and a ring resonator coupled to the memristor and configured to modulate light based on the on or off state of the memristor.

2. The apparatus of claim 1, further comprising:
a first control waveguide configured to receive a first optical signal,
wherein the photodetector includes a first photodiode coupled to the first control waveguide to receive the first optical signal, wherein the first photodiode converts the first optical signal into a first photocurrent that programs the memristor to the on or off state.

3. The apparatus of claim 2, further comprising:
a second control waveguide configured to receive a second optical signal,
wherein the photodetector further includes a second photodiode coupled to the second control waveguide to receive the second optical signal, wherein the second photodiode converts the second optical signal into a second photocurrent, wherein the memristor is programmed by a sum of the first photocurrent and the second photocurrent to the on or off state.

4. The apparatus of claim 2, further comprising:
an input waveguide coupled to a first side of the ring resonator; and
an output waveguide coupled to a second side of the ring resonator.

5. The apparatus of claim 3, further comprising:
an input waveguide coupled to a first side of the ring resonator; and
an output waveguide coupled to a second side of the ring resonator.

6. The apparatus of claim 1, wherein the memristor comprises:
a first electrode;
a second electrode; and
one or more oxide layers interposed between the first electrode and the second electrode.

7. The apparatus of claim 6, wherein the one or more metal oxide layers comprise one or more of aluminum oxide, zirconium oxide, and hafnium oxide.

8. The apparatus of claim 1, wherein:
when the memristor is programmed to the on state, the ring resonator is configured to modulate a first wavelength; and
when the memristor is programmed to the off state, the ring resonator is configured to modulate a second wavelength, wherein the first wavelength is shorter than the second wavelength.

9. The apparatus of claim 3, wherein the first photodiode is biased at a first voltage and the second photodiode is biased at a second voltage, wherein the first voltage and second voltage are in opposite potentials.

10. An apparatus, comprising:
a light source;
a light modulator;
an input waveguide coupled between the light source and a first side of the light modulator; and
an output waveguide coupled to a second side of the light modulator,
wherein the light modulator comprises:
a photodetector;
a memristor coupled to the photodetector, wherein the photodetector is configured to receive and convert optical signals to electrical signals and output the electrical signals through an electrical line to the memristor to program the memristor to an on or off state; and a ring resonator coupled to the memristor and configured to modulate light from the light source based on the on or off state of the memristor.

11. The apparatus of claim 10, wherein the light modulator further comprises:
a first control waveguide configured to receive a first optical signal,
wherein the photodetector includes a first photodiode coupled to the first control waveguide to receive the first optical signal, wherein the first photodiode converts the first optical signal into a first photocurrent that programs the memristor to the on or off state.

12. The apparatus of claim 11, wherein the light modulator further comprises:
a second control waveguide configured to receive a second optical signal,
wherein the photodetector further includes a second photodiode coupled to the second control waveguide to receive the second optical signal, wherein the second photodiode converts the second optical signal into a second photocurrent, wherein the memristor is programmed by a sum of the first photocurrent and the second photocurrent to the on or off state.

13. The apparatus of claim 10, wherein the memristor comprises:
a first electrode;
a second electrode; and
one or more oxide layers interposed between the first electrode and the second electrode.

14. The apparatus of claim 13, wherein the one or more metal oxide layers comprise one or more of aluminum oxide, zirconium oxide, and hafnium oxide.

15. The apparatus of claim 10, wherein:
when the memristor is programmed to the on state, the ring resonator is configured to modulate a first wavelength; and
when the memristor is programmed to the off state, the ring resonator is configured to modulate a second wavelength, wherein the first wavelength is shorter than the second wavelength.

16. The apparatus of claim 12, wherein the first photodiode is biased at a first voltage and the second photodiode is biased at a second voltage, wherein the first voltage and second voltage are in opposite potentials.

17. An apparatus, comprising:
a light source;
a light modulator;
an input waveguide coupled between the light source and a first side of the light modulator; and
an output waveguide coupled to a second side of the light modulator,
wherein the light modulator comprises:
a photodetector;
a first control waveguide coupled to the photodetector, wherein the first control waveguide is configured to provide a first optical signal to the photodetector;
a second control waveguide coupled to the photodetector, wherein the second control waveguide is configured to provide a second optical signal to the photodetector;
a memristor coupled to the photodetector, wherein the photodetector is configured to receive and convert the optical signals to electrical signals to program the memristor to an on or off state;

a ring resonator coupled to the memristor and configured to modulate light from the light source based on the on or off state of the memristor.

18. The apparatus of claim 17,
wherein the photodetector includes a first photodiode coupled to the first control waveguide to receive the first optical signal, wherein the first photodiode converts the first optical signal into a first photocurrent,
wherein the photodetector further includes a second photodiode coupled to the second control waveguide to receive the second optical signal, wherein the second photodiode converts the second optical signal into a second photocurrent, wherein the memristor is programmed by a sum of the first photocurrent and the second photocurrent to the on or off state.

19. The apparatus of claim 17, wherein:
when the memristor is programmed to the on state, the ring resonator is configured to modulate a first wavelength; and
when the memristor is programmed to the off state, the ring resonator is configured to modulate a second wavelength, wherein the first wavelength is shorter than the second wavelength.

20. The apparatus of claim 18, wherein the first photodiode is biased at a first voltage and the second photodiode is biased at a second voltage, wherein the first voltage and second voltage are in opposite potentials.

* * * * *